United States Patent
Maurio et al.

[11] Patent Number: 6,066,902
[45] Date of Patent: May 23, 2000

[54] ENERGY RECOVERY ARRANGEMENT FOR A POWER ELECTRIC SWITCH

[75] Inventors: Joseph M. Maurio, Waterford, Conn.; Edgar S. Thaxton, Bradford, R.I.

[73] Assignee: Electric Boat Corporation, Groton, Conn.

[21] Appl. No.: 09/167,353

[22] Filed: Oct. 7, 1998

[51] Int. Cl.[7] .................................................. H01H 37/00
[52] U.S. Cl. ........................ 307/117; 136/201; 136/203
[58] Field of Search .............................. 307/66, 112, 117, 307/125, 130; 257/930; 136/200, 203, 204, 205, 224; 62/3.2, 3.7

[56] References Cited

U.S. PATENT DOCUMENTS

| | | |
|---|---|---|
| 3,252,013 | 5/1966 | Stanton . |
| 3,316,474 | 4/1967 | Lode . |
| 3,648,152 | 3/1972 | Shimada . |
| 4,004,210 | 1/1977 | Yater . |
| 4,097,829 | 6/1978 | Cohen . |
| 5,100,821 | 3/1992 | Fay . |
| 5,220,189 | 6/1993 | Higashi . |
| 5,261,747 | 11/1993 | Deacutis et al. . |
| 5,419,780 | 5/1995 | Suski . |
| 5,457,342 | 10/1995 | Herbst, II . |
| 5,517,468 | 5/1996 | Inoue et al. . |
| 5,544,488 | 8/1996 | Reid . |
| 5,576,512 | 11/1996 | Doke . |
| 5,623,119 | 4/1997 | Yater et al. . |
| 5,705,770 | 1/1998 | Ogasawara et al. . |
| 5,712,448 | 1/1998 | Vandersande et al. . |
| 5,714,829 | 2/1998 | Guruprasad . |

*Primary Examiner*—Jeffrey Gaffin
*Assistant Examiner*—Robert L. Deberadinis
*Attorney, Agent, or Firm*—Baker Botts, LLP

[57] ABSTRACT

In the embodiments disclosed in the specification, a thermoelectric generator is provided in a layer between a heat transfer plate and a plurality of power electronic switches and the voltage generated by the thermoelectric generator is used to control switching of the switches. When the voltage generated by the thermoelectric generator is insufficient to control the switches, power source is taken from the power to be controlled by the switches and stepped down for use in controlling the switches.

7 Claims, 2 Drawing Sheets

6,066,902

ENERGY RECOVERY ARRANGEMENT FOR A POWER ELECTRIC SWITCH

BACKGROUND OF INVENTION

This invention relates to energy recovery arrangements for power electronic switches.

In many electric power converter systems, semiconductor switches capable of high frequency operation are used to control the current and voltage at the output terminals of the circuit. The development of semiconductor switches has led to devices capable of switching high currents at high frequencies. One result of such high frequency operation is increased power losses as a result of the finite turn on and turn off times of the electronic switches. In addition, high current operation results in increased power loss due to current conduction through the semiconductor switches and diodes. Both of these power loss mechanisms generate heat that must be dissipated so that the semiconductor switches are not damaged.

Manufacturers of high-power electronic switches typically provide modules containing the electronic switches and in some cases include protective circuitry but many times it is left up to the circuit designer to provide the interface between the switch module and the control circuitry. For MOS-gated switches the interface circuit contains the gate drive electronics which are necessary to turn the electronic switches on and off. This circuitry requires its own power source which is usually separate from or isolated from the main power supply to the electronic switch.

U.S. Pat. No. 5,419,780 discloses a thermoelectric generator sandwiched between a semiconductor device and a heat sink to generate electric power in response to a temperature difference between the semiconductor device and the heat sink. The power generated by the thermoelectric generator is used to operate a fan to cool the heat sink. U.S. Pat. No. 5,576,512 discloses a thermoelectric generator which is compatible with power sources providing different voltages, along with series and parallel connection circuitry for connecting the thermoelectric devices in series or in parallel depending on the voltage supplied from the power source. U.S. Pat. No. 3,316,474 describes a thermoelectric transformer for transferring electrical energy from one or more driving circuits to one or more driven circuits and U.S. Pat. No. 5,220,189 discloses a semiconductor device switched by a thermoelectric sensing element, while U.S. Pat. No. 3,252,013 discloses the use of thermoelectric devices for controlling a switch.

SUMMARY OF THE INVENTION

It is an object of the present invention to provide an energy recovery circuit arrangement for a power electronic switch which overcomes disadvantages of the prior art.

Another object of the invention is to provide a power electronic switch arrangement that requires no external power supply for interface circuitry.

These and other objects of the invention are attained by providing a power semiconductor switch module having an integral thermoelectric generator sandwiched between one or more semiconductor power switches and a heat transfer plate to generate power for switching the semiconductor power switches. In a preferred embodiment, the module includes a primary DC input and a DC/DC converter to provide multiple isolated DC voltages to power the semiconductors and the heat generated by those components is also used to power the thermoelectric generator. An external DC source supplies switching power to the semiconductor switches during start up until the module generates enough heat to cause the thermoelectric generator to supply sufficient power to control the switching.

BRIEF DESCRIPTION OF THE DRAWINGS

Further objects and advantages of the invention will be apparent from a reading of the following description in conjunction with the accompanying drawings, in which.

DESCRIPTION OF PREFERRED EMBODIMENTS

Figure 1:
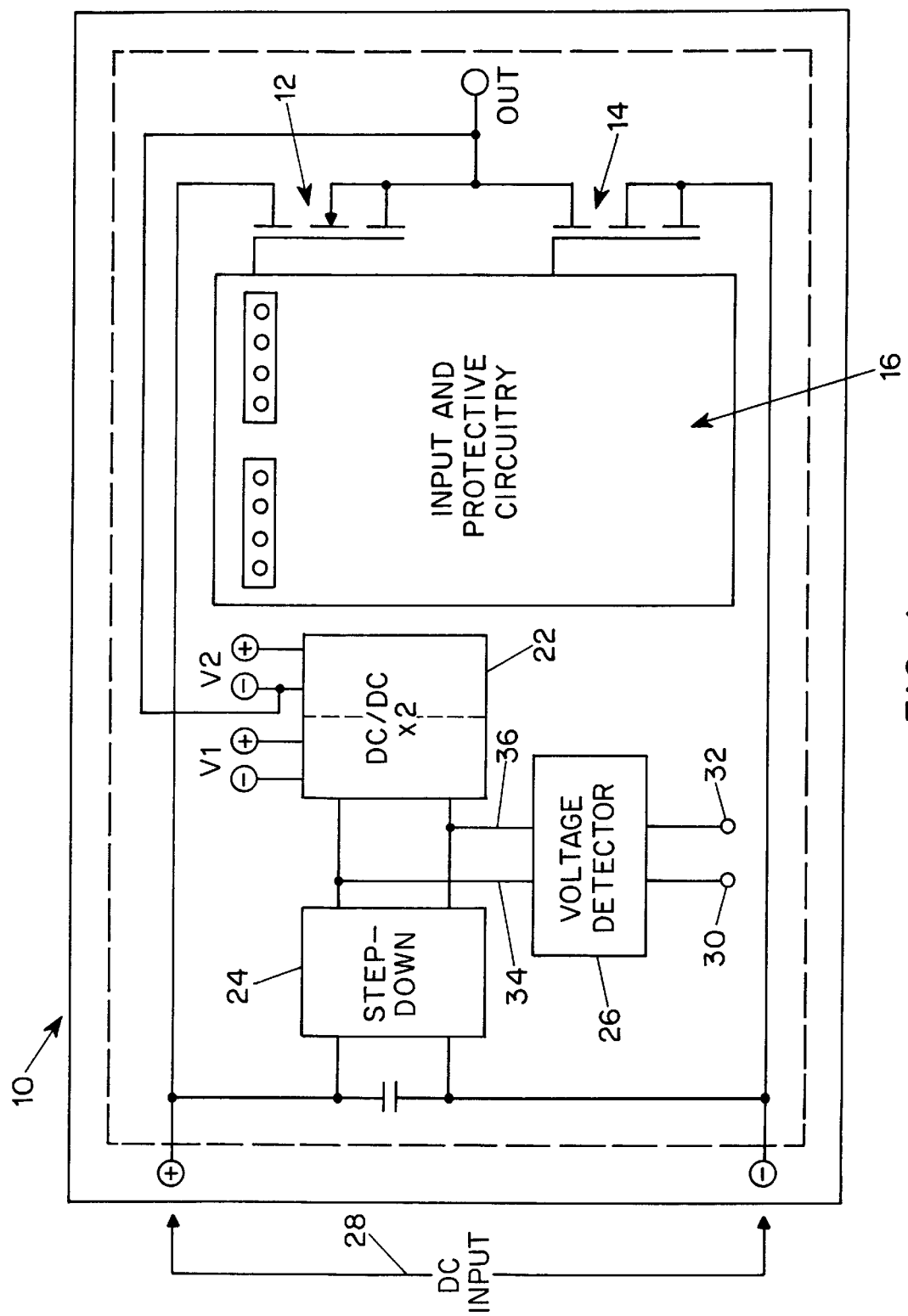
FIG. 1 is a schematic plan view illustrating a representative embodiment of an electronic power switch and protective circuitry in accordance with the invention.
Figure 2:
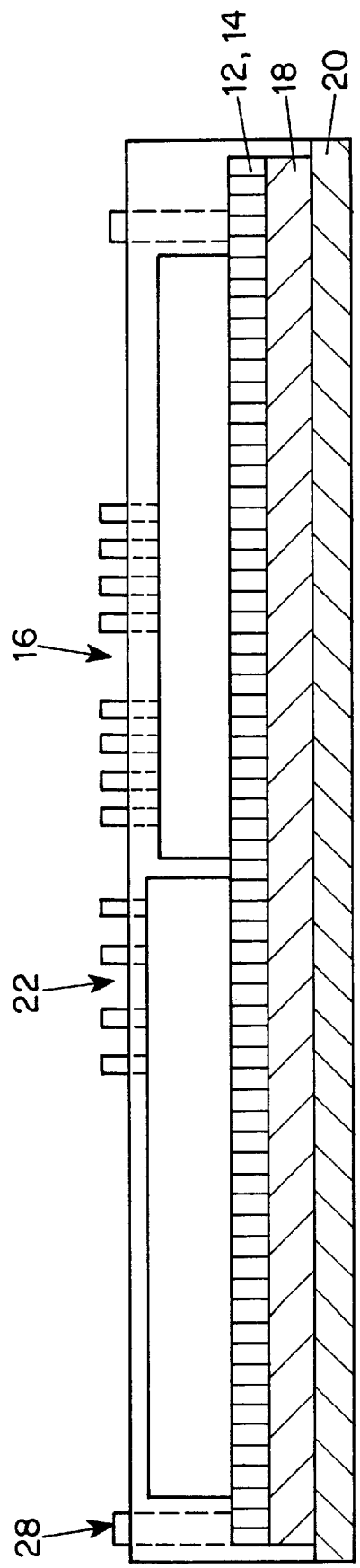
FIG. 2 is a schematic cross-sectional view of the arrangement shown in FIG. 1.

In the typical embodiment of the invention illustrated in the drawings, a power electronic switch module 10 includes two MOS-gated power electronic switches 12 and 14 which may be IGBTs, MOSFETs or MCTs, for example, and conventional protective circuitry 16 for the switches 12 and 14. In addition, as shown in FIG. 2, the arrangement includes a thermoelectric generating layer 18 on which the power switches and protective circuitry are mounted and a heat transfer plate 20 on which the thermoelectric plate 18 is mounted.

Also mounted on the thermoelectric generator layer is a DC/DC converter 22, which is a single unit containing the magnetic and control circuitry that produces two electrically isolated output voltages from a single DC input, as well as a step-down converter 24 and a voltage detector 26 connected across the DC input 28. Two terminals 30 and 32 are connected to the thermoelectric generator 18 to supply power through the voltage detector 26 to corresponding lines 34 and 36 which are connected to the DC/DC converter 22.

The DC/DC converter is designed so that its input resistance is matched to the internal resistance of the thermoelectric generator. This resistance-matching yields the highest output power from the thermoelectric generator. It will be understood that, even though only two electronic switches 12 and 14 are shown in the drawing, any number of electronic switches may be used, providing a corresponding increase in the number of DC/DC converter output voltages.

During normal operation of the arrangement at its rated current and voltage, a temperature difference exists between the power electronic semiconductor material and the heat exchange surface of the module as a result of conduction and switching power losses. The thermoelectric generator utilizes this temperature difference to produce a voltage which is supplied to the DC/DC converter which converts the low voltage produced by the thermoelectric generator to a regulated voltage to be used for the gate driver circuitry of the switches. The thermoelectric generator may consist of several thermocouples electrically arranged in series to produce an adequate voltage and arranged in parallel thermally to provide sufficient current.

During start up or at times when operation of the switches does not produce a sufficient amount of heat, a separate source of power is needed for the DC/DC converter output. This is provided from the DC input 28 through the step-down converter 24 and the DC/DC converter 22 or, alternatively, from a charge pump, a pulse transformer, chemical energy storage device, or any other appropriate energy source known to those skilled in the art. In the illustrated embodiment, a capacitor provides power for start up and operating conditions when there is insufficient heat available for the thermoelectric generator. Under either of these conditions the step-down converter converts the input DC voltage to a lower voltage. An advantage of this arrangement is that control circuit power is available whenever there is a DC input voltage. The step-down converter output voltage is then supplied to the DC/DC converter in place of the thermoelectric generator voltage output and is used to power the gate circuitry until the thermoelectric generator is able to produce adequate voltage for the operation of the DC/DC converter. The voltage detector 26 disables the step-down converter 24 when the thermoelectric generator is producing sufficient voltage to control the switches.

Conventional thermoelectric generators have an efficiency in the 5% to 10% range. Thus, using today's technology, the disclosed arrangement is capable of converting 5% to 10% of the heat energy from power switch losses into gate drive circuitry power, making the arrangement practical for use with power electronic switches which are rated for 5 kilowatts and above, assuming power modules that operate with efficiency in the 95% to 99.5% range.

In another embodiment the thermoelectric generators are mounted on the cold plate of a power converter system and used to produce electrical power from the waste heat of all the components attached to the cold plate. A generator of this type can be incorporated into existing designs or employed in new designs since the thermoelectric generator would not be integral with the semiconductor switches. A percentage of all of the waste heat of the system would be converted to electricity to be used for control circuit power.

Although the invention has been described herein with reference to specific embodiments, many modifications and variations therein will readily occur to those skilled in the art. Accordingly, all such variations and modifications are included within the intended scope of the invention.

We claim:

1. A power electronic switch arrangement comprising a plurality of power electronic switches, control circuit means for controlling the operation of the switches, thermoelectric generator means for producing electric power from heat generated by the power electronic switches and supplying the generated power to the control circuit means and a heat transfer plate for dissipating heat generated by the power electronic switches, wherein the thermoelectric generator means is disposed between the power electronic switches and the heat transfer plate.

2. A power electronic switch arrangement according to claim 1, including converter means for converting voltage from input power to be switched by the power electronic switches to a reduced voltage to provide an alternate power source for the control circuit means when the electric power produced by the thermoelectric generator means is insufficient to control the operation of the switches.

3. A power electronic switch arrangement according to claim 2, wherein the converter means has an internal resistance which is matched to an internal resistance of the thermoelectric generator means.

4. A power electronic switch arrangement according to claim 2, which includes voltage detection means for detecting the voltage produced by the thermoelectric generator means and applying power from the alternate power source to the control circuit means when the voltage produced by the thermoelectric generator is insufficient to control the operation of the switches.

5. A power electronic switch arrangement according to claim 2, wherein the thermoelectric generator means is positioned between the plurality of power electronic switches and the converter means on one side and the heat transfer plate on another side.

6. A power electronic switch arrangement according to claim 1, wherein the thermoelectric generator means is disposed as a layer on the heat transfer plate and the plurality of power electronic switches are disposed on the thermoelectric generator means.

7. A power electronic switch arrangement according to claim 6, including voltage converter means and protective circuitry disposed on the thermoelectric generator means.

* * * * *